(12) United States Patent
Gros-Jean

(10) Patent No.: US 8,709,907 B2
(45) Date of Patent: Apr. 29, 2014

(54) METHOD FOR MANUFACTURING AND REOXIDIZING A TIN/TA$_2$O$_5$/TIN CAPACITOR

(75) Inventor: Mickael Gros-Jean, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/364,823

(22) Filed: Feb. 2, 2012

(65) Prior Publication Data

US 2012/0199947 A1 Aug. 9, 2012

(30) Foreign Application Priority Data

Feb. 4, 2011 (FR) ...................................... 11 50923

(51) Int. Cl.
*H01L 21/20* (2006.01)
*H01L 21/02* (2006.01)

(52) U.S. Cl.
USPC .................. 438/396; 257/532; 257/E27.048; 257/E21.396

(58) Field of Classification Search
USPC ............ 257/532, E27.048, E21.396; 438/396
See application file for complete search history.

(56) References Cited

U.S. PATENT DOCUMENTS 7,820,507 B2 * 10/2010 Choi ............................ 438/253
2002/0086476 A1 7/2002 Kim et al.

FOREIGN PATENT DOCUMENTS

EP 1035564 A2 9/2000
WO WO 0220870 A1 3/2002

OTHER PUBLICATIONS

French Search Report and Written Opinion dated Sep. 8, 2011 from corresponding French Application No. 11/50923.
Thomas, M., et al., *Impact of TaN/Ta Copper Barrier on Full PEALD TiN/Ta$_2$O$_5$/TiN 3D Damascene MIM Capacitor Performance*, International Interconnect Technology Conference, IEEE 2007, PI, Jun. 1, 2007, pp. 158-160, XP031111801.

* cited by examiner

*Primary Examiner* — Victor A Mandala
(74) *Attorney, Agent, or Firm* — Wolf, Greenfield & Sacks, P.C.

(57) ABSTRACT

A method for manufacturing a TiN/Ta2O5/TiN capacitor, including the steps of forming a Ta$_2$O$_5$ layer on a TiN support by a plasma-enhanced atomic layer deposition method, or PEALD; and submitting the obtained structure to an N$_2$O plasma for a duration sufficient to oxidize the Ta$_2$O$_5$ layer without oxidizing the TiN support.

7 Claims, 1 Drawing Sheet

METHOD FOR MANUFACTURING AND REOXIDIZING A TIN/TA$_2$O$_5$/TIN CAPACITOR

CROSS REFERENCE TO RELATED APPLICATIONS

This application claims the priority benefit of French patent application number 11/50923, filed on Feb. 4, 2011, entitled METHOD OF MANUFACTURING AND REOXIDIZING A TIN/TA2O5/TIN CAPACITOR, which is hereby incorporated by reference to the maximum extent allowable by law.

BACKGROUND

1. Technical Field

Embodiments relate to the manufacturing of a TiN/Ta$_2$O$_5$/TiN capacitor and more specifically to a method for reoxidizing the Ta$_2$O$_5$ layer after its forming on a TiN support.

2. Discussion of the Related Art

The use of TiN/Ta$_2$O$_5$/TiN-type capacitors has increased over the last years, especially on account of their compatibility with the manufacturing of the metallization levels of an integrated circuit and because, due to the high dielectric constant of Ta$_2$O$_5$, they can have high capacitances for small surface areas. Such capacitors are, for example, used to form the capacitors of DRAM-type memory cells, of radio frequency filters, or of analog-to-digital converters.

Among methods for forming such capacitors, a plasma enhanced atomic layer deposition method has been provided to form the Ta$_2$O$_5$ layer, this method presently called PEALD.

This method comprises alternating phases of tantalum deposition from a precursor, currently, the so-called TBTDET product, that is, tertbutylimido-tris-diethylamino tantalum, and phases of application of an oxygen plasma. Then, an upper TiN electrode is deposited by any adapted method.

Among the qualities which are expected from a capacitor, it is especially desired for it to have as low a leakage current as possible, preferably below $10^{-7}$ A/cm$^2$. The dielectric relaxation factor is also desired to be reduced. This relaxation factor, FR, characterizes the capacitance variation of a capacitor according to frequency and is defined by relation FR=[C(1 kHz)–C(10 kHz)]/C. Thus, this factor characterizes the capacitance variation of a capacitor between an operation at a 1-kilohertz frequency and an operation at a 10-kilohertz frequency. Physically, this factor is linked to the presence of dipoles in the dielectric and to the relaxation time of these dipoles.

Various standards set the desired values of the relaxation factor. Present standards need for this relaxation factor to be, in percent, smaller than 0.2 for a capacitor operation at 25° C. and smaller than 0.6 for a capacitor operation at 125° C.

To obtain such leakage current characteristics and the dielectric relaxation factor, the applicant has provided:

all along the PEALD process, to limit the temperature within a range from 200 to 250° C., during the steps of tantalum deposition from TBTDET, limiting the partial TBTDET pressure within a range from 0.05 to 5 Pa, preferably from 0.5 to 2 Pa, preferably on the order of 1 Pa to within 10%, and during phases of application of an oxygen plasma, limiting the partial oxygen pressure within a range from 1 to 2,000 Pa, preferably from 10 to 30 Pa, preferably to 25 Pa to within 10%.

The applicant has shown that this choice provides optimized results in terms of leakage current and of dielectric relaxation factor.

After the steps of forming of the Ta$_2$O$_5$ layer on a TiN support, it can be observed that there inevitably still remain defects, and especially oxygen vacancies.

To improve the state of the Ta$_2$O$_5$ layer, a reoxidizing is known to be desirable at the end of the process.

However, experience shows that reoxidations performed up to now provide very inhomogeneous results and can even alter some characteristics, especially the leakage current or the dielectric relaxation factor of the finally-obtained capacitor. Further, in the case of the integration of MIM (Metal-Insulator-Metal) structures at the level the interconnects of a circuit, the processing temperature must be lower than 400° C., or even lower than 350° C., to preserve the integrity of the interconnects.

There thus is a need to improve the reoxidizing process of a Ta$_2$O$_5$ layer in a capacitor of TiN/Ta$_2$O$_5$/TiN type.

SUMMARY OF THE INVENTION

An embodiment provides a method for reoxidizing a Ta$_2$O$_5$ layer formed on a TiN support which improves all the characteristics of the finally-obtained capacitor and which especially decreases its leakage current and its dielectric relaxation factor.

Another embodiment provides an improved capacitor.

Thus, an embodiment provides a method for manufacturing a TiN/Ta$_2$O$_5$/TiN capacitor, comprising the steps of:

forming a Ta$_2$O$_5$ layer on a TiN support by a plasma-enhanced atomic layer deposition method, or PEALD; and submitting the obtained structure to an N$_2$O plasma for a duration sufficient to oxidize the Ta$_2$O$_5$ layer without oxidizing the TiN support.

According to an embodiment, to determine said sufficient duration, successive trials are performed and cuttings through the Ta$_2$O$_5$/TiN structure and analyses of the composition of the interface are carried out, to determine the processing duration after which the entire Ta$_2$O$_5$ layer is reoxidized while the TiN support and the TiN/Ta$_2$O$_5$ interface are untouched.

According to an embodiment, during the application of the N$_2$O plasma, the substrate temperature is maintained between 300 and 400° C.

According to an embodiment, the substrate temperature is maintained within the range from 370 to 390° C.

According to an embodiment, during the plasma oxidation, the partial N$_2$O pressure is maintained between 10 and 3,000 Pa.

According to an embodiment, during the plasma oxidation, the partial N$_2$O pressure is maintained between 400 and 600 Pa.

An embodiment provides a TiN/Ta$_2$O$_5$/TiN capacitor wherein the interface area between the TiN support layer and the Ta$_2$O$_5$ layer has a thickness smaller than 2 nm.

The foregoing and other objects, features, and advantages will be discussed in detail in the following non-limiting description of specific embodiments in connection with the accompanying drawings.

DETAILED DESCRIPTION

Figure 1:
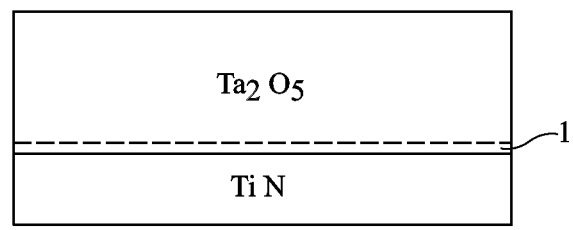
FIG. 1 shows a Ta$_2$O$_5$ layer formed on a TiN support.

FIG. 1 shows a Ta$_2$O$_5$ layer obtained by plasma-enhanced atomic layer deposition on a TiN substrate. There inevitably exists an interface region 1 between TiN and $Ta_2O_5$ comprising titanium, tantalum, oxygen, and nitrogen atoms in various proportions. The method of deposition of $Ta_2O_5$ on TiN will have been carried out to reduce the thickness of this layer.

For the reoxidizing of the $Ta_2O_5$ layer, oxygen plasmas in the presence of argon are generally used, but the reoxidizing effect due to oxygen radicals is generally counterbalanced by the presence of argon, which is a reducer for $Ta_2O_5$, and the number of oxygen vacancies present in the structure is not notably decreased.

Pure oxygen plasmas thus should be used. The disadvantage of such plasmas is that they are inevitably generated with a high power provided to the plasma generation system and that they are extremely active, that is, very energetic radicals are generated. Thus, the penetration of oxygen into the $Ta_2O_5$ layer is very difficult to control. Either the penetration is not sufficient and the $Ta_2O_5$ layer is not sufficiently processed across its entire thickness, or the oxygen penetrates all the way to the TiN layer. Conventionally, this had not been considered as a disadvantage since titanium oxides also form a dielectric of strong dielectric constant.

However, the applicant has observed that the presence of such titanium oxides and the increase in the interface layer thickness would actually alter the characteristics of the leakage current and the dielectric relaxation factor of the finally-obtained capacitor.

Thus, the applicant provides performing a reoxidation of the $Ta_2O_5$ layer which accurately stops at the level of the $Ta_2O_5$/TiN interface. To achieve this result, the applicant provides using an oxidizing plasma, which is easier to produce with a low power provided to the plasma generation system than a pure oxygen plasma. For this purpose, the applicant provides using a $N_2O$ plasma which is much less aggressive than a pure $O_2$ plasma. Thus, the penetration of oxygen into the $Ta_2O_5$ layer is controllable (from 5 to 120 seconds for a layer of a 50-nm thickness). The plasma oxidation step can then be stopped when the $Ta_2O_5$/TiN limit has been reached.

In practice, to set the machine, successive trials will be carried out and cuttings through the $Ta_2O_5$/TiN structures and analyses of the interface composition will be performed. The time at which then entire $Ta_2O_5$ is reoxidized TiN while the TiN layer and the TiN/$Ta_2O_5$ interface are still untouched can thus be determined. Once this time has been determined, the machine will be set to operate according to the duration resulting from the previous trials.

Figure 2:
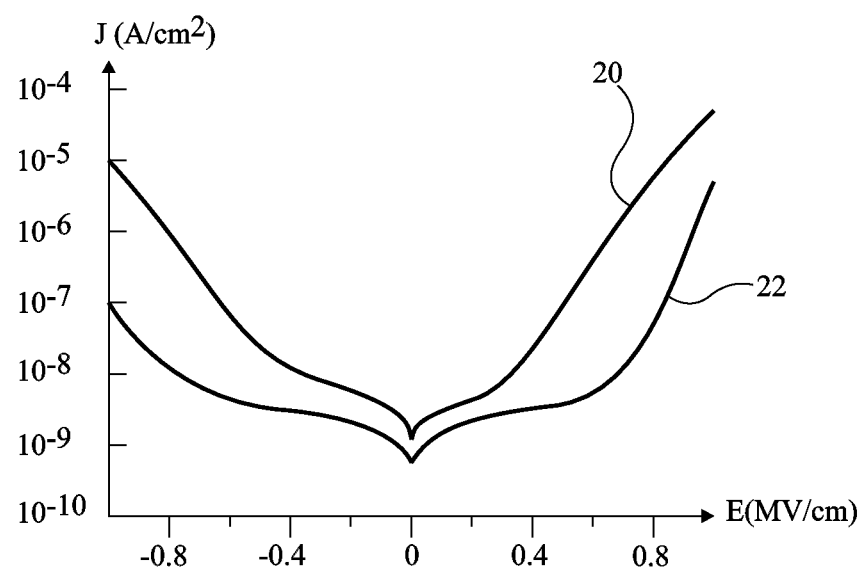
FIG. 2 shows leakage currents of a TiN/Ta$_2$O$_5$/TiN capacitor before and after reoxidation according to an embodiment.

FIG. 2 shows the leakage current in amperes per $cm^2$ according to the applied electric field in MV/cm for a $Ta_2O_5$ layer on a TiN substrate. Curve 20 shows the leakage current density before reoxidation and curve 22 shows the leakage current density after reoxidation. The leakage current density remains lower than $10^{-7}$ A/$cm^2$ in the currently-used electric field range, from −1 to +1 MV/cm. Further, the applicant has observed that the dielectric relaxation factor, after a reoxidation processing such as described hereabove, is at least as small as before the processing.

A specific embodiment of the reoxidation process comprises using a substrate temperature from 300 to 400° C., preferably close to 380° C. to within 5%. The pressure of pure $N_2O$ ranges from 10 to 3,000 Pa, for example from 400 to 600 Pa, preferably 500 Pa to within 10%. The power of the plasma is maintained at its minimum value to obtain an ionizing of plasma gases.

The use of the disclosed method causes that the thickness of the interface layer between $Ta_2O_5$ and TiN is smaller than 2 nm, after the reoxidation processing. Thus, embodiments aim at the product formed of a TiN/$Ta_2O_5$/TiN capacitor in which the thickness of the interface layer between $Ta_2O_5$ and TiN is smaller than 2 nm, after the reoxidation processing.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a TiN/$Ta_2O_5$/TiN capacitor, comprising the steps of:

forming a $Ta_2O_5$ layer on a TiN support by a plasma-enhanced atomic layer deposition method, or PEALD; and submitting the obtained structure to an $N_2O$ plasma for a duration sufficient to oxidize the $Ta_2O_5$ layer without oxidizing the TiN support.

2. The method of claim 1, wherein, to determine said sufficient duration, successive trials are performed and cuttings through the $Ta_2O_5$/TiN structure and analyses of the composition of the interface are carried out, to determine the processing duration after which the entire $Ta_2O_5$ layer is reoxidized while the TiN support and the TiN/$Ta_2O_5$ interface are untouched.

3. The method of claim 1, wherein, during the application of the $N_2O$ plasma, the substrate temperature is maintained between 300 and 400° C.

4. The method of claim 3, wherein the substrate temperature is maintained within the range from 370 to 390° C.

5. The method of claim 1, wherein, during the plasma oxidation, the partial $N_2O$ pressure is maintained between 10 and 3,000 Pa.

6. The method of claim 5, wherein, during the plasma oxidation, the partial $N_2O$ pressure is maintained between 400 and 600 Pa.

7. A TiN/$Ta_2O_5$/TiN capacitor wherein the interface area between the TiN support layer and the $Ta_2O_5$ layer has a thickness smaller than 2 nm.

\* \* \* \* \*